(12) United States Patent
Otremba

(10) Patent No.: US 7,683,477 B2
(45) Date of Patent: Mar. 23, 2010

(54) SEMICONDUCTOR DEVICE INCLUDING SEMICONDUCTOR CHIPS HAVING CONTACT ELEMENTS

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/768,587

(22) Filed: Jun. 26, 2007

(65) Prior Publication Data
US 2009/0001554 A1 Jan. 1, 2009

(51) Int. Cl.
H01L 23/34 (2006.01)
H01L 23/053 (2006.01)
H01L 23/12 (2006.01)
H01L 23/02 (2006.01)
H01L 23/20 (2006.01)
H01L 23/16 (2006.01)
H01L 23/58 (2006.01)
H01L 23/06 (2006.01)
H01L 23/48 (2006.01)
H01L 23/52 (2006.01)

(52) U.S. Cl. .............. 257/723; 257/678; 257/679; 257/680; 257/681; 257/682; 257/683; 257/684; 257/685; 257/700; 257/701; 257/725; 257/E23.001; 257/E23.016; 257/E23.049; 257/E23.056; 257/690

(58) Field of Classification Search ......... 257/678–684, 257/690, 685, 700–701, 723, 725, E23.001, 257/E23.016, E23.049, E23.056
See application file for complete search history.

(56) References Cited

U.S. PATENT DOCUMENTS

| | | | | |
|---|---|---|---|---|
| 3,829,646 A | * | 8/1974 | Lorteije et al. | 200/513 |
| 4,652,970 A | * | 3/1987 | Watari et al. | 361/699 |
| 4,744,007 A | * | 5/1988 | Watari et al. | 361/718 |
| 6,107,674 A | | 8/2000 | Zommer | |
| 6,121,682 A | * | 9/2000 | Kim | 257/723 |
| 6,218,202 B1 | * | 4/2001 | Yew et al. | 438/15 |
| 6,242,802 B1 | * | 6/2001 | Miles et al. | 257/738 |
| 6,344,687 B1 | * | 2/2002 | Huang et al. | 257/724 |
| 6,531,784 B1 | * | 3/2003 | Shim et al. | 257/777 |
| 6,538,313 B1 | * | 3/2003 | Smith | 257/684 |
| 6,617,680 B2 | * | 9/2003 | Chien-Chih et al. | 257/698 |
| 6,747,348 B2 | * | 6/2004 | Jeung et al. | 257/686 |
| 6,756,689 B2 | | 6/2004 | Nam et al. | |
| 6,853,060 B1 | * | 2/2005 | Seok et al. | 257/678 |
| 6,909,178 B2 | * | 6/2005 | Sakamoto et al. | 257/725 |
| 6,919,643 B2 | | 7/2005 | Wheeler et al. | |
| 6,960,826 B2 | * | 11/2005 | Ho et al. | 257/723 |
| 7,115,922 B2 | | 10/2006 | Nadd et al. | |
| 7,335,987 B2 | * | 2/2008 | Huang | 257/734 |
| 7,335,994 B2 | * | 2/2008 | Klein et al. | 257/778 |
| 7,538,419 B2 | * | 5/2009 | Shen | 257/686 |
| 2002/0163077 A1 | * | 11/2002 | Kuwahara et al. | 257/723 |
| 2003/0178627 A1 | * | 9/2003 | Marchl et al. | 257/80 |
| 2004/0262781 A1 | * | 12/2004 | Germain et al. | 257/787 |
| 2005/0023682 A1 | * | 2/2005 | Nakao | 257/738 |
| 2005/0269676 A1 | * | 12/2005 | Lee et al. | 257/678 |
| 2006/0006510 A1 | * | 1/2006 | Koduri | 257/678 |

(Continued)

*Primary Examiner*—Ida M Soward
(74) *Attorney, Agent, or Firm*—Dicke, Billig & Czaja, PLLC

(57) ABSTRACT

A semiconductor device is disclosed. One embodiment provides a device including a carrier, an electrically insulating layer arranged over the carrier and a first semiconductor chip arranged over the electrically insulating layer, wherein the first semiconductor chip has a first contact element on a first surface and a second contact element on a second surface.

18 Claims, 2 Drawing Sheets

U.S. PATENT DOCUMENTS

| | | | |
|---|---|---|---|
| 2006/0134826 A1* | 6/2006 | Kheng | 438/106 |
| 2006/0175627 A1 | 8/2006 | Shiraishi | |
| 2007/0216011 A1* | 9/2007 | Otremba et al. | 257/690 |
| 2008/0112141 A1* | 5/2008 | Bauer et al. | 361/728 |
| 2008/0191342 A1* | 8/2008 | Otremba | 257/723 |

* cited by examiner

SEMICONDUCTOR DEVICE INCLUDING SEMICONDUCTOR CHIPS HAVING CONTACT ELEMENTS

BACKGROUND

This invention relates to a semiconductor device and a fabrication method thereof.

Power semiconductor chips may, for example, be integrated into semiconductor devices. Power semiconductor chips are suitable in particular for the switching or control of currents and/or voltages.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
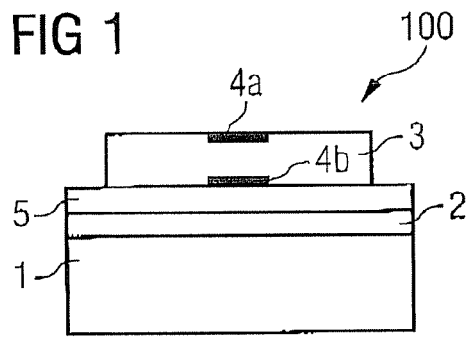
FIG. 1 schematically illustrates a cross section of a device 100 as an exemplary embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

In the following, embodiments are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of embodiments. It may be evident, however, to a person skilled in the art that one or more aspects of the embodiments may be practiced with a lesser degree of these specific details. In other instances, known structures and devices are illustrated in block diagram form in order to facilitate describing one or more aspects of the embodiments. The following description is therefore not to be taken in a limiting sense, and the scope of the application is defined by the appended claims.

Devices with a semiconductor chip arranged over a carrier are described below. The carrier may be of any shape, size or material. During the fabrication of the device the carrier may be provided in a way that other carriers are arranged in the vicinity and are connected by connection means to the carrier with the purpose of separating the carriers. The carrier may be fabricated from metals or metal alloys, in particular copper, copper alloys, aluminum, aluminum alloys, or other materials. It may further be electrically conductive and may serve, inter alia, as a heat sink for dissipating the heat generated by the semiconductor chip. For example, the carrier may be a lead-frame consisting of one or more die pads and pins.

Semiconductor chips as described below may be of extremely different types and may include for example integrated electrical or electro-optical circuits. The semiconductor chips may be, for example, configured as power transistors, power diodes, control circuits, microprocessors or microelectromechanical components. In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in particular on its two main surfaces, that is to say on its top side and bottom side. In particular, power transistors and power diodes may have a vertical structure. By way of example, the source terminal and gate terminal of a power transistor and the anode terminal of a power diode may be situated on one main surface, while the drain terminal of the power transistor and the cathode terminal of the power diode are arranged on the other main surface. A power diode may be embodied in particular as a Schottky diode. Furthermore, the devices described below may include integrated circuits to control the integrated circuits of other semiconductor chips, for example, the integrated circuits of power transistors or power diodes. The semiconductor chips need not be manufactured from specific semiconductor material and, furthermore, may contain inorganic and/or organic materials that are not semiconductors, such as for example insulators, plastics or metals. Moreover, the semiconductor chips may be packaged or unpackaged.

The described semiconductor chips have contact elements which allow electrical contact to be made with the semiconductor chips. The contact elements may be composed of any desired electrically conductive material, for example of a metal, such as aluminum, gold or copper, a metal alloy or an electrically conductive organic material. The semiconductor chips have at least one first contact element on a first surface and at least one second contact element on a second surface. The contact elements may be situated on one or more active surfaces of the semiconductor chips or on other surfaces of the semiconductor chips.

In the case of the device including more than one semiconductor chip, the semiconductor chips may be in a functional relationship to each other. For example, one of the semiconductor chips may control another one of the semiconductor chips.

The devices described below further contain an electrically insulating layer arranged over the carrier. The electrically insulating layer may consist of any material, for example it may contain metal oxides (in particular aluminum oxide, silver oxide, titanium oxide, copper oxide, chromium oxide or zinc oxide), semiconductor oxide (in particular silicon oxide), epoxy resin, diamond-like carbon, imides, organic materials, ceramic materials, glasses or polymers, such as parylene. If the electrically insulating layer is fabricated from silicon oxide, it may further contain other elements, such as phosphorus or boron.

The thickness of the electrically insulating layer may, for example, be in the range between 10 nm and 150 µm, in particular it may be in the range between 1 µm and 50 µm and more particular it may be in the range between 1 µm and 10 µm. The electrically insulating layer may be thermally conductive. The thermal conductivity of the electrically insulating layer may, for example, be in the range between 0.01 W/mK and 500 W/mK, in particular in the range between 0.1 W/mK and 50 W/mK. The electrically insulating layer may have a high blocking capability to provide a good electrical insulation. The values for the blocking capability may, for example, be in the range between 1 V/µm and 1000 V/µm, in particular in the range between 10 V/µm and 200 V/µm and more particular in the range between 100 V/µm and 200 V/µm.

The electrically insulating layer may cover any fraction of any number of surfaces of the carrier and may additionally cover any other component of the device to any degree, in particular the semiconductor chips and the contact elements of the semiconductor chips.

The electrically insulating layer may be fabricated by any means appropriate to fabricate an electrically insulating layer. For example, planar techniques may be employed to fabricate the electrically insulating layer. The term "electrically insulating" refers to the property of the layer to be at most only marginally electrically conductive relatively to other components of the device. In particular, the term "electrically insulating" refers to the at most only marginal electrical conductivity in a direction mainly perpendicular to the plane of extension of the electrically insulating layer.

The electrically insulating layer may have adhesive properties with respect to the carrier and also to possible molding materials applied to the device with the purpose of packaging the part of the carrier where semiconductor chips are placed. The adhesiveness of the electrically insulating layer with respect to molding materials and/or the carrier may vary according to the material of the molding materials and/or the carrier.

During the fabrication of the device, parts of the electrically insulating layer may be removed in order to be able to establish electrical connections between components of the device. For example, prior to applying the electrically insulating layer to the carrier, contact elements or parts of the semiconductor chips may be covered by a masking layer to prevent the electrically insulating layer to be deposited on the areas covered by the masking layer. After the deposition of the electrically insulating layer, the masking layer is lifted off. Furthermore, when using a galvanic method to deposit the electrically insulating layer, an appropriate electrical potential may be applied to the contact elements of the semiconductor chip to prevent the contact elements to be covered with the electrically insulating layer. Further methods used during the deposition process are e.g., etching or sputtering methods.

A further example of an implementation of the electrically insulating layer is an electrically insulating foil, which is laminated on the carrier and structured. The structuring of such an electrically insulating foil may for example be achieved by a stamping process, laser ablation or any suitable process known to a person skilled in the art. In the case of the carrier being implemented as a lead-frame including a die pad and pins, the electrically insulating foil may bridge gaps between the die pad and the pins. The electrically insulating foil may act as a platform for the deposition of further layers.

The devices described below may further include an electrically conductive layer arranged between the electrically insulating layer and at least one of the semiconductor chips. The electrically conductive layer may be fabricated by any means appropriate to fabricate electrically conductive layers. Exemplary fabrication methods are galvanic or chemical deposition processes. In principle, the fabrication processes for the electrically conductive layer may be of similar type as the above-mentioned fabrication processes for the fabrication of the electrically insulating layer (e.g., masking, etching, etc.).

Regarding its geometric form or material composition, the electrically conductive layer may be fabricated arbitrarily. The electrically conductive layer may for example be embodied as a plurality of longish structures or an area-wide coating. Any conductive material may be employed for its fabrication, like for example metals (copper, aluminum, gold, etc.), metal alloys or organic conductors. Generally, the electrically conductive layer does not need to be fabricated homogeneously or only from one specific material, i.e. various compositions and concentrations of the materials contained in the electrically conductive layer are possible.

The electrically conductive layer may provide electrical connections between different components of the device. In the case of the carrier being embodied as a lead-frame including a die pad and pins, the electrically conductive layer may in particular provide an electrical coupling between the semiconductor chips and the pins of the lead-frame.

It is to be noted that the number of electrically insulating and/or electrically conductive layers used to fabricate the device may respectively not be limited to one or two. As a matter of fact, any number of layers stacked on top of each other may be provided. Multiple electrically insulating layers may be stacked on top of each other, but may also be separated by one or more electrically conductive layers. Each of the multiple electrically insulating layers and/or the electrically conductive layers may respectively have a different thickness, material composition and degree of carrier-covering than the remaining number of electrically insulating layers and/or electrically conductive layers used to fabricate the device.

The devices described herein may further include a molding compound or package covering parts of the device. The molding compound may, for example, be made of a thermoplastic resin or a thermosetting plastic, for example epoxy resin. For example, at least one surface of the carrier may not completely be covered with the molding compound. In this manner, a coupling of the carrier to a heat sink may provided. The heat sink may be manufactured of a material with a high thermal conductivity (for instance a metal or a metal alloy) to support the heat transport away from the device. Furthermore, the device may be mounted onto a circuit board, with the surface of the carrier which is not covered with the molding compound facing the circuit board.

FIG. 1 schematically illustrates a device 100 in a cross section as an exemplary embodiment. The device 100 includes a carrier 1, an electrically insulating layer 2 arranged over the carrier 1 and a first semiconductor chip 3 arranged over the electrically insulating layer 2. The first semiconductor chip 3 illustrates a first contact element 4a on its upper surface and a second contact element 4b on its bottom surface that faces the carrier 1. It is understood that the first semiconductor chip 3 may include further contact elements depending on its desired functionality.

The device 100 may further include an electrically conductive layer 5 arranged between the electrically insulating layer 2 and the first semiconductor chip 3. The electrically conductive layer 5 may be in contact with the second contact element 4b thereby providing the possibility of an electrical connection between the first semiconductor chip 3 and further electrical components (not illustrated). It is to be noted that the electrically insulating layer 2 may electrically isolate the carrier 1 from the first semiconductor chip 3 and/or the electrically conductive layer 5. Furthermore, the electrically insulating layer 2 may be thermally conductive. In this case, the electrically insulating layer 2 may conduct the heat generated by the first semiconductor chip 3 to the carrier 1.

Figure 2A:
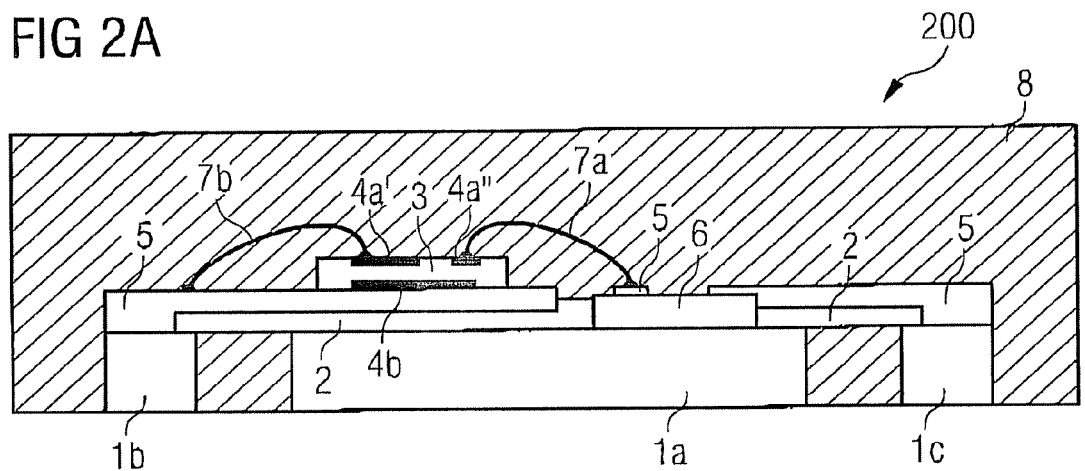
FIG. 2a schematically illustrates a cross section of a device 200 as a further exemplary embodiment.

FIG. 2a schematically illustrates a device 200 in a cross section as a further exemplary embodiment. The device 200 includes a carrier element, which in this case is embodied as a lead-frame consisting of a die pad 1a and pins 1b and 1c. Due to the chosen perspective of FIG. 2a, the pins 1b and 1c hide further pins arranged behind them. It is well known to a person skilled in the art that the number of pins of a lead-frame may be arbitrary and generally depends on the overall functionality of the device 200. It is to be noted that FIG. 2a is best viewed in combination with FIG. 2b that illustrates the top plan view of the device 200.

The device 200 further includes an electrically insulating layer 2 arranged over the die pad 1a and the pins 1b and 1c. As already mentioned in preceding paragraphs, the electrically insulating layer 2 may be made of any materials, fabricated in various ways and be of arbitrary geometrical form depending on the desired functionality of the device 200. For example, the electrically insulating layer 2 may be deposited by planar techniques. In FIG. 2a, the electrically insulating layer 2 bridges the gaps between the die pad 1a and the depicted pins 1b and 1c, respectively. In this manner, it becomes possible to deposit further layers over the electrically insulating layer 2 even in the region of the gaps. Naturally, the device 200 may further include pins that are not connected to the die pad 1a by using the electrically insulating layer 2. It is to be noted that the electrically insulating layer 2 is opened (or alternatively not deposited) at certain areas to provide the possibility to electrically connect the underlying layers or components.

The device 200 further includes a second semiconductor chip 6, which may have the function of controlling the first semiconductor chip 3. The control chip 6 may be applied onto the die pad 1a by arbitrary techniques well know in the art. For example, the control chip 6 may be attached to the die pad 1a via a soldering process, like soft-soldering, hard-soldering or diffusion-soldering. Another possibility to attach the control chip 6 to the die pad 1a may be the employment of an adhesive layer, which may be electrically conductive or insulating. In the case of the device 200, the control chip 6 is in direct contact with the die pad 1a. It would, however, also be possible to attach the control chip 6 on the electrically insulating layer 2, as long as the functionality of the device 200 is not undesirably changed. Consequently, the processes of attaching the control chip 6 and depositing the electrically insulating layer 2 are interchangeable.

The device 200 further includes an electrically conductive layer 5 deposited over the electrically insulating layer 2, the pins 1b and 1c and parts of the control chip 6. Similar to the electrically insulating layer 2 beneath it, the electrically conductive layer 5 may be made of any materials, deposited in various ways and be of arbitrary geometrical form depending on the desired functionality of the device 200. The electrically conductive layer 5 may establish electrical connections between the pins 1b and 1c and further components of the device 200, such as the semiconductor chips 3 and 6. In the case of the pin 1c, an electrical connection to the control chip 6 has been implemented by using the electrically conductive layer 5. The pin 1c may be connected to external devices on its bottom side (or generally on positions that are not covered by other components of the device, like e.g., a molding compound). The electrically conductive layer 5 deposited on the control chip 6 may also be used to attach other electrically conductive elements, such as bond wires (cf. the attached bond wire 7a on the top side of the control chip 6).

In the present embodiment, the first semiconductor chip 3 is implemented as a power MOSFET (Metal Oxide Semiconductor Field Effect Transistor) 3. On the top surface of the power MOSFET 3, two contact elements 4a' and 4a" are arranged with the contact element 4a' representing a source terminal and the contact element 4a" representing a gate terminal. A contact element 4b representing a drain terminal is arranged on the bottom surface of the power MOSFET 3. The arrangement of the contact elements 4a', 4a" and 4b leads to an electric current flowing in a direction perpendicular to the main surfaces of the power MOSFET 3. The power MOSFET 3 is applied onto the electrically conductive layer 5 by using, for example, a soldering process (e.g., soft-soldering, hard-soldering, diffusion-soldering), but may also be attached to the electrically conductive layer 5 via an adhesive layer.

Figure 2B:
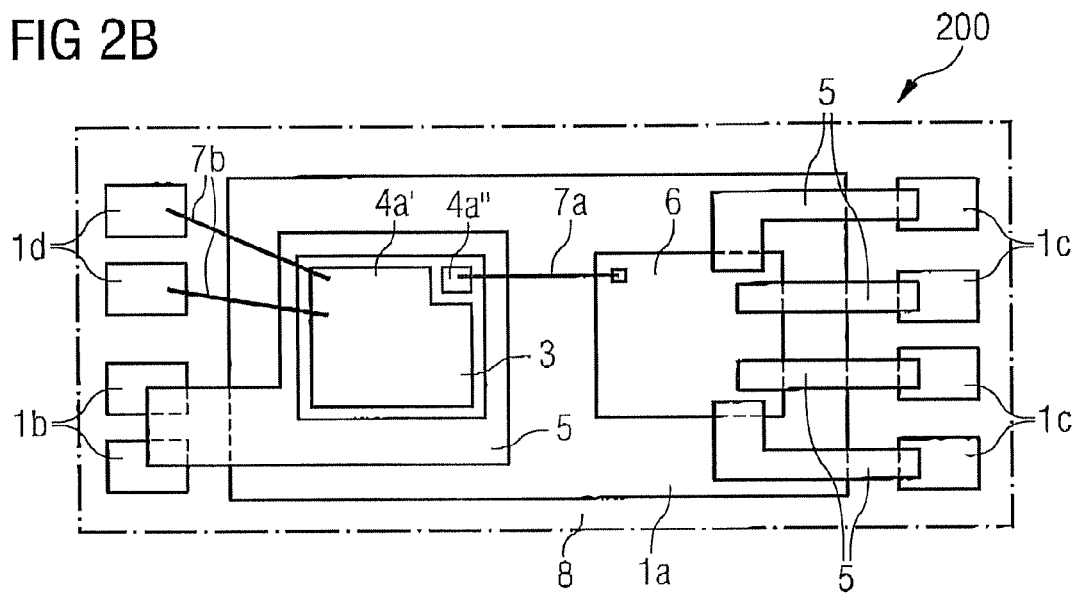
FIG. 2b schematically illustrates a top plan view of the device 200.

The contact element 4a" (i.e. the gate terminal) on the top surface of the power MOSFET 3 is electrically coupled to the control chip 6 by a bond wire 7a. Naturally, this electrical connection could also be established by an electrically conductive layer or a clip. The two semiconductor chips 3 and 6 are functionally coupled to each other, with the control chip 6 controlling the power MOSFET 3. The contact element 4a' (i.e. the source terminal) on the top surface of the power MOSFET 3 is electrically coupled to one or more of the pins 1d of the lead-frame. The pins 1d cannot be seen from FIG. 2a due to their arrangement behind the pins 1b. The connection is established by a bond wire 7b (not completely apparent), but may also be realized by an electrically conductive layer or a clip. The pins 1d may be connected to external devices via their bottom surfaces. The contact element 4b (i.e. the drain terminal) on the bottom surface of the power MOSFET 3 is electrically coupled to the pin 1b by the electrically conductive layer 5. As illustrated in FIG. 2b, the electrically conductive layer 5 may also provide a connection to multiple drain pins 1b. The drain pins 1b may be connected to external devices via their bottom surfaces.

It is to be noted that due to the arrangement of the electrically insulating layer 2 and the electrically conductive layer 5, the power MOSFET 3 and in particular its drain terminal 4b are electrically insulated from the control chip 6 and the die pad 1a. The drain voltage of a power MOSFET can be up to 1 kV or more. Since the die pad 1a is electrically insulated from the power MOSFET 3 (i.e. they do not have the same electrical potential), the control chip 6 may contact the die pad 1a without experiencing any damage caused by the high voltages of the power MOSFET 3.

Components of the device 200 may be covered with a molding compound 8. The molding compound 8 may be implemented according to preceding paragraphs and usually serves to protect components of the device 200 against environmental influences like dirt, humidity or mechanical impact. In FIGS. 2a and 2b, the molding compound 8 does not cover the respective bottom sides of the pins 1b, 1c and 1d, as well as the bottom side of the die pad 1a.

A heat sink, which is not illustrated in FIG. 2a, may be thermally coupled to the die pad 1a. During operation, the heat generated by the power MOSFET 3 and the control chip 6 may be dissipated away from the device 200 by the heat sink. An effective dissipation path proceeds from the bottom surfaces of semiconductor chips 3 and 6 towards the heat sink, thereby crossing the layers 2 and 5 and the die pad 1a. The thickness and the material of the electrically insulating layer 2 should thus be chosen in a way to provide both, a high thermal conductivity and good insulating properties at the same time. The bottom surface of the device 200 may also be used to mount the device 200 on a circuit board, for example a PCB (Printed Circuit Board). The parts of the die pad 1a and the pins 1b to 1d, which are not covered with the molding compound 8 can be soldered to contact areas of the circuit board.

FIG. 2b schematically illustrates a top plan view of the device 200 with the context between FIGS. 2a and 2b being self-explanatory to a person skilled in the art. The molding compound 8 encapsulates most of the components of the device 200 and is simply indicated by a dashed line. Due to the chosen perspective and for the sake of clarity the electrically insulating layer 2 is not explicitly illustrated. It becomes apparent from FIG. 2b that the lead-frame includes multiple drain pins 1b, multiple pins 1c contacting the control chip 6 and multiple source pins 1d. It is to be noted that FIG. 2b explicitly illustrates the connection between the source pins 1d and the power MOSFET 3 by using the bond wires 7b, which are not completely apparent in FIG. 2a.

In FIGS. 3a to 3f different stages of the fabrication of the device 200 are exemplarily illustrated. In order to manufacture the device 200, first the lead-frame including the die pad 1a and the pins 1b to 1d are provided (see FIG. 3a). The lead-frame may be fabricated from a metal, such as copper, iron, nickel or aluminum, or a metal alloy or another electrically conductive material. The control chip 6 is then mounted onto the die pad 1a (see FIG. 3b).

Figure 3A:
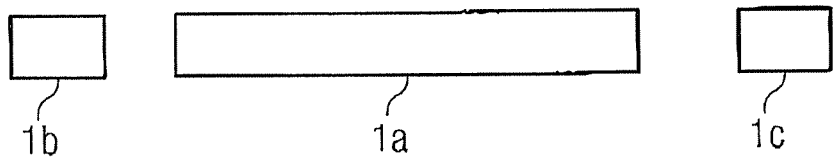
FIGS. 3a to 3f schematically illustrate an exemplary embodiment of a method to fabricate the device 200.
Figure 3B:
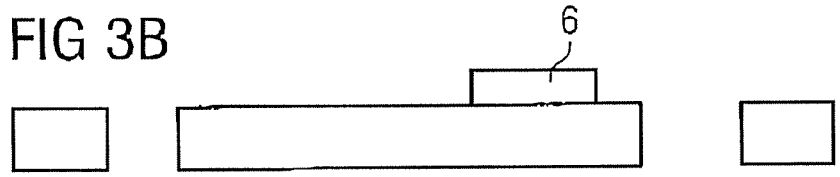
Figure 3C:
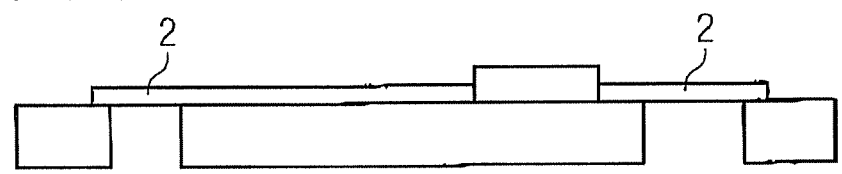

An electrically insulating foil 2 is deposited on top of the die pad 1a and the pins 1b and 1c to bridge the gaps between them (see FIG. 3c). The electrically insulating foil 2 may, for example, be laminated onto the lead-frame and may be structured by a stamping process, laser ablation or any other suitable process known to a person skilled in the art. The electrically insulating foil 2 may be manufactured from a plastic or synthetic material or any other suitable material.

Figure 3D:
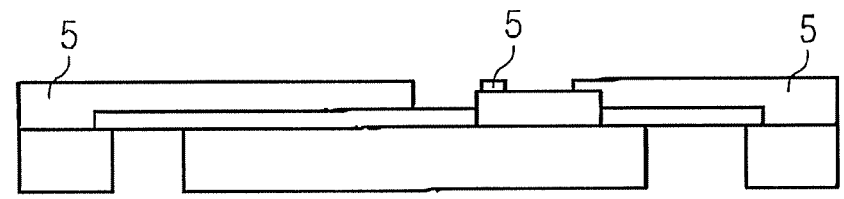

The electrically insulating foil 2 may act as a platform for the deposition of further layers, such as the electrically conductive layer 5 (see FIG. 3d). The electrically conductive layer 5 may be deposited using any appropriate deposition method, such as electroless or galvanic plating processes, physical vapor deposition, chemical vapor deposition, sputtering, spin-on processes, spray depositing or ink jet printing. Copper, iron, nickel or other metals or metal alloys may be used as materials for the electrically conductive layer 5.

Figure 3E:
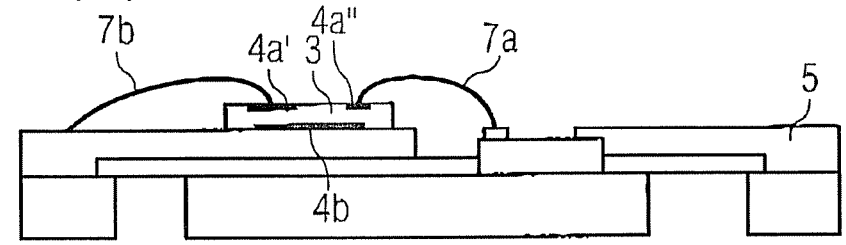
Figure 3F:
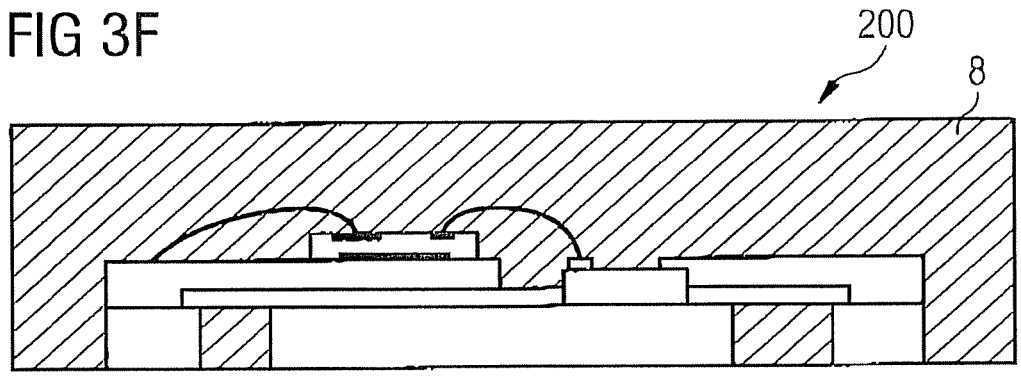

The power MOSFET 3 may be placed on the electrically conductive layer 5 with its drain terminal 4b facing the die pad 1a (see FIG. 3e). The electrical connection between the drain terminal 4b and the electrically conductive layer 5 may, for example, be produced by reflow soldering, vacuum soldering, diffusion soldering or adhesive bonding by using a electrically conductive adhesive.

If diffusion soldering is used as a connecting technique, it is possible to use solder materials which lead to intermetallic phases after the end of the soldering operation at the interface between the drain terminal 4b and the electrically conductive layer 5 on account of interface diffusion processes. In this case, the use of AuSn, AgSn, CuSn, AgIn, AuIn or CuIn solders is conceivable. If the power MOSFET 3 is adhesively bonded to the electrically conductive layer 5, it is possible to use conductive adhesives which may be based on epoxy resins and be enriched with gold, silver, nickel or copper in order to produce the electrical conductivity.

Other electrical connections with the terminals 4a' and 4a" on the top surface of the power MOSFET 3 may be established by the bond wires 7a and 7b as illustrated in FIG. 3e.

The molding compound 8 is used to encapsulate the device 200 (see FIG. 3e). The molding compound 8 may encapsulate any portion of the device 200, but leaves the bottom surfaces of the die pad 1a and the pins 1b to 1d uncovered. Furthermore, as illustrated in FIG. 3e the bottom surfaces of the die pad 1a and the pins 1b to 1d as well as a surface of the molding compound 8 may form a plane. The molding compound 8 may be composed of any appropriate thermoplastic or thermosetting material, in particular it may be composed of material commonly used in contemporary semiconductor packaging technology. Various techniques may be employed to cover the components of the device 200 with the molding compound 8, for example compression molding or injection molding.

In addition, while a particular feature or aspect of an embodiment may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
 a carrier;
 an electrically insulating layer arranged over the carrier;
 a first semiconductor chip arranged over the electrically insulating layer, wherein the first semiconductor chip has a first contact element on a first surface and a second contact element on a second surface and wherein the insulating layer electrically insulates the first semiconductor chip from the carrier; and
 a second semiconductor chip arranged over the carrier.

2. The device of claim 1, wherein the first semiconductor chip is a power semiconductor.

3. The device of claim 1, wherein the carrier is electrically conductive.

4. The device of claim 1, wherein the carrier comprises a die pad and pins.

5. The device of claim 1, wherein the electrically insulating layer is an electrically insulating foil.

6. The device of claim 1, wherein the second semiconductor chip comprises a control circuit to control the first semiconductor chip.

7. The device of claim 1, wherein the second semiconductor chip is applied onto the carrier.

8. The device of claim 1, further comprising a molding compound, wherein a surface of the carrier is only partially covered with the molding compound.

9. The device of claim 1, wherein a heat sink is coupled to a surface of the carrier.

10. The device of claim 1, further comprising an electrically conductive layer arranged between the electrically insulating layer and the first semiconductor chip.

11. The device of claim 10, wherein the electrically conductive layer electrically couples the first semiconductor chip to at least one pin.

12. A device, comprising:
a carrier, wherein the carrier comprises a die pad and pins;
an electrically insulating layer arranged over the carrier, wherein the electrically insulating layer bridges at least one gap between the die pad and at least one of the pins;
a first semiconductor chip arranged over the electrically insulating layer, wherein the first semiconductor chip has a first contact element on a first surface and a second contact element on a second surface; and
a second semiconductor chip arranged over the carrier.

13. A device, comprising:
a carrier;
an electrically insulating layer arranged over the carrier;
a first semiconductor chip arranged over the electrically insulating layer, wherein the first semiconductor chip has a first contact element on a first surface and a second contact element on a second surface;
a second semiconductor chip arranged over the carrier; and
an electrically conductive layer which extends to a surface of the second semiconductor chip, the surface of the second semiconductor chip facing away from the carrier.

14. A device, comprising:
a carrier;
an electrically insulating layer arranged over the carrier;
an electrically conductive layer arranged over the electrically insulating layer;
a first semiconductor chip arranged over the electrically conductive layer, wherein a first surface of the semiconductor chip comprises a first contact element and faces the electrically conductive layer and wherein the insulating layer electrically insulates the first semiconductor chip from the carrier; and
a second semiconductor chip arranged over the carrier.

15. A device, comprising:
a carrier, wherein the carrier comprises a die pad and pins;
an electrically insulating layer arranged over the carrier; and
a first semiconductor chip arranged over the electrically insulating layer, wherein the first semiconductor chip has a first contact element on a first surface and a second contact element on a second surface and wherein the insulating layer electrically insulates the first semiconductor chip from the carrier.

16. A device, comprising:
a carrier;
an electrically insulating layer arranged over the carrier, wherein the electrically insulating layer is an electrically insulating foil; and
a first semiconductor chip arranged over the electrically insulating layer, wherein the first semiconductor chip has a first contact element on a first surface and a second contact element on a second surface and wherein the insulating layer electrically insulates the first semiconductor chip from the carrier.

17. A device, comprising:
a carrier;
an electrically insulating layer arranged over the carrier;
a first semiconductor chip arranged over the electrically insulating layer, wherein the first semiconductor chip has a first contact element on a first surface and a second contact element on a second surface; and
a second semiconductor chip arranged over the carrier, wherein the second semiconductor chip is applied onto the carrier.

18. A device, comprising:
a carrier;
an electrically insulating layer arranged over the carrier;
a first semiconductor chip arranged over the electrically insulating layer, wherein the first semiconductor chip has a first contact element on a first surface and a second contact element on a second surface; and
a second semiconductor chip arranged over the carrier, wherein the second semiconductor chip comprises a control circuit to control the first semiconductor chip.

* * * * *